United States Patent [19]

Moyal

[11] Patent Number: 4,994,891

[45] Date of Patent: Feb. 19, 1991

[54] SHIELDED TRANSISTOR DEVICE

[75] Inventor: Miki Moyal, Austin, Tex.

[73] Assignee: Advanced Micro Devices, Austin, Tex.

[21] Appl. No.: 369,572

[22] Filed: Jun. 20, 1989

[51] Int. Cl.$^5$ .............................................. H01L 29/40
[52] U.S. Cl. ...................................... 357/53; 330/253; 330/261; 307/296.2; 307/296.4; 307/296.5; 307/296.8
[58] Field of Search ................... 357/53; 330/253, 261; 307/296.2, 296.4, 296.5, 296.8

[56] References Cited

U.S. PATENT DOCUMENTS

| | | | |
|---|---|---|---|
| 4,288,802 | 9/1981 | Ronen | 357/53 |
| 4,290,078 | 9/1981 | Ronen | 357/53 |
| 4,308,549 | 12/1981 | Yeh | 357/53 |
| 4,412,242 | 10/1983 | Herman et al. | 357/53 |
| 4,634,894 | 1/1987 | Shu et al. | 307/496 |
| 4,692,689 | 9/1987 | Takemae | 307/296.8 |
| 4,788,455 | 11/1988 | Mori et al. | 307/296.8 |

*Primary Examiner*—Rolf Hille
*Assistant Examiner*—Steven Loke
*Attorney, Agent, or Firm*—Salzman & Levy

[57] ABSTRACT

The invention comprises an operational amplifier circuit having a shielded transistor device whose drain is surrounded by a gate comprising an annular ribbon of polysilicon. The gate is connected to a trackable potential that fluctuates but is keyed to a voltage slightly above the average between the positive and negative circuit bias. The shielded transistor device allows the operational amplifier circuit of which it is a part to function at extended voltage levels of 12 volts.

19 Claims, 2 Drawing Sheets

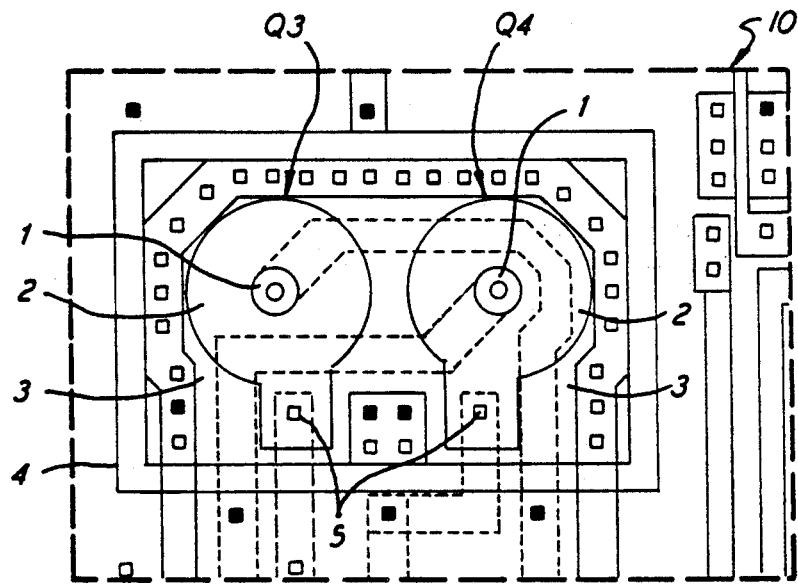
FIG. 1
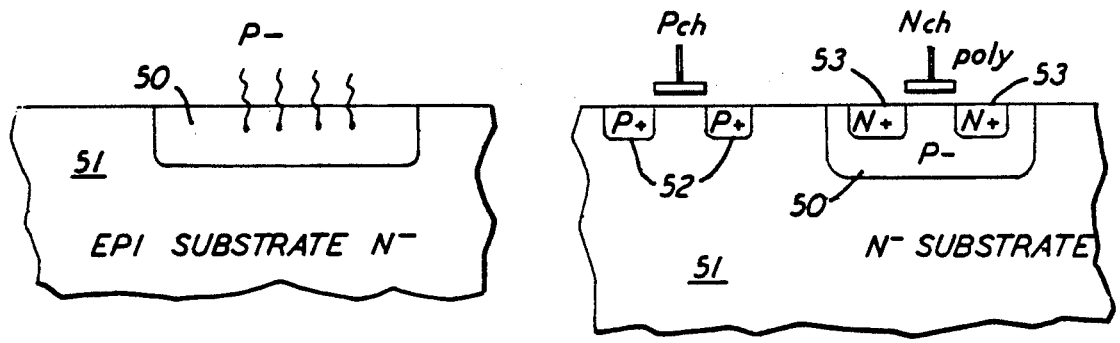
FIG. 2a
FIG. 2b

SHIELDED TRANSISTOR DEVICE

FIELD OF THE INVENTION

The invention relates to transistorized circuitry, and more particularly to transistorized circuits that are workable in a 12 volt range, where the transistors themselves are not ordinarily operative above 5 to 6 volts.

BACKGROUND OF THE INVENTION

In the design of conventional operational amplifier circuitry utilizing CMOS technologies, it has been known that higher operational voltages are desirable. The higher operating voltages provide low output impedance per device size, greater dynamic range and avoidance of early clipping.

Higher voltages have been limited in such circuitry due to the low field threshold turn-on voltages of the transistors resulting from field parasitics. Also, higher doping on the drain junctions forces lower break-down from drain-to-source and drain-to-bulk. A bipolar action usually takes place from the higher field around the drains, which limits the operating voltages, and forces narrow design constraints.

In many other circuit applications, it is necessary to employ both low supply and high supply sources.

To improve the speed of audio processing chips (CODECS), it is desirable to use small transistors (in the sub-micron region) to gain both speed and density. But for the on chip analog-to-digital and digital-to-analog conversion, higher voltage swings are desirable to provide a greater dynamic range, avoid early clippings and, to provide a very clean low impedance mid-level ground.

In DMOS devices where threshold voltages are close to 3 volts, a driver with at least 4 times the threshold voltage, i.e., 12 volts, is desired in order to provide low turn-on impedance.

Accordingly, higher voltage MOS transistors have been fabricated by surrounding the drain with a high resistance layer of Al polycrystalline silicon (polysilicon). The high resistance layer prevents field concentration near an edge of a gate electrode.

Such a teaching is presented in U.S. Pat. Nos. 4,614,959, issued to: Nakagawa on Sept. 30, 1986; and 4,766,474, issued to Nakagawa et al. on Aug. 23, 1988.

While the aforementioned shielding is effective for its intended purposes, it nevertheless has some drawbacks:
  (a) such devices usually require special doping processes that add to the complexity and cost of manufacture; and
  (b) such shielding, while providing higher operating voltages, usually falls short of operation voltage levels above 10 volts, that are required for high performance circuits.

SUMMARY OF THE INVENTION

The present invention features transistorized circuitry whose operational voltages (both input and output) are above the process capability, i.e., above the transistor field thresholds and snap-back limitations.

The transistor devices of this invention accomplish this result without modifying the ordinary fabricating processes, thus keeping costs in check.

The transistor device of the invention features encircling a drain electrode with a gate electrode comprising an annular ribbon of polysilicon. The drain electrode is made small, such that the surface area of the surrounding gate electrode is at least 5 times that of the drain electrode surface area. The circular configuration also provides improved heat dissipation which, in conjunction with the electrical shielding capabilities, increases the operational voltage level of the device.

In order to exceed the 10 volt threshold, and operate at a voltage of about 12 volts, the invention has tied the gate electrode of the transistor device to trackable voltage source, whose potential fluctuates and is keyed to an average of the positive and negative circuit bias. Thus, if the source voltages drift, the gate electrode will always see the same potential, which is the average of the two.

A box-like field plate shield surrounding the transistor device provides further electrical isolation, as does channel stops that are disposed between the transistor device and other components.

Noise is effectively suppressed in the circuit by placing a capacitor between the trackable source and the transistor gate electrode.

It is an object of the invention to provide a shielded transistor device that is operative in a voltage range beyond 10 volts.

It is another object of this invention to provide a shielded transistor device that can be fabricated by standard CMOS processes.

It is still another object of this invention to provide a shielded transistor device that can be functional above its normally operative voltage range.

BRIEF DESCRIPTION OF THE DRAWINGS

These and other objects of the invention will be better understood and become more apparent with reference to the subsequent detailed description considered in conjunction with the accompanying detailed description, in which:

FIG. 1 is a chip plan view of the transistor device of this invention;

FIGS. 2a and 2b are sectional views depicting the masking stages in the CMOS process for fabricating the circuit illustrated in FIG. 2.

DETAILED DESCRIPTION OF THE INVENTION

Figure 2:
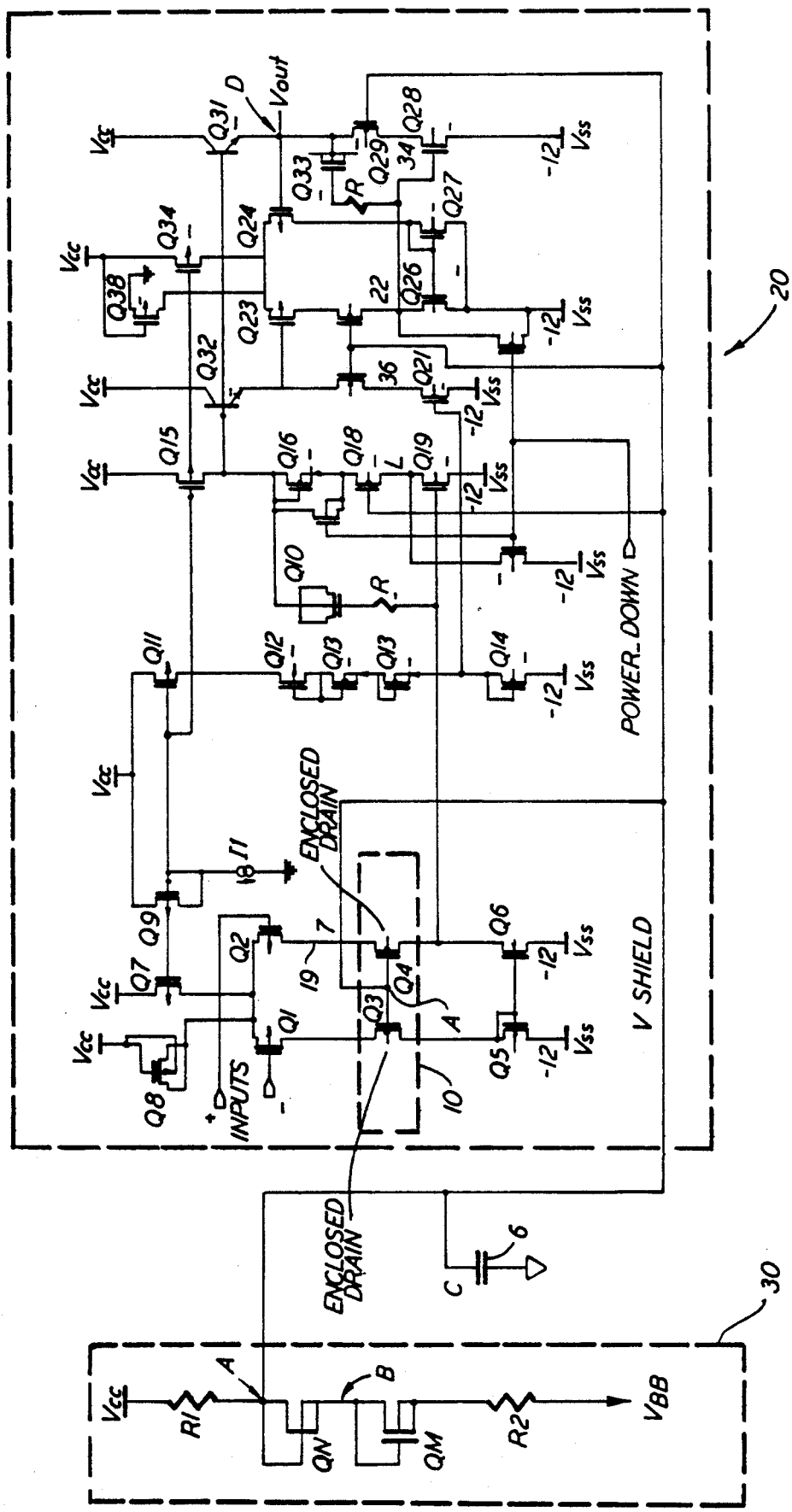
FIG. 2 is a schematic diagram of an operational amplifier circuit incorporating the transistor device of this invention, which is shown in FIG. 1.

Generally speaking, the invention features an operational amplifier circuit constructed with a novel shielded transistor device that provides for operation of the circuit at extended voltage levels generally above those that normally cause breakdown of the transistor. The transistor device has its gate connected to a source of potential that fluctuates and is keyed to a level above the average of the positive and negative circuit bias.

Referring to FIG. 1, a chip plan view of two transistors $Q_3$ and $Q_4$ is shown. The aforementioned transistors are also illustrated in greater detail in the circuit diagram of FIG. 2, described below. Each transistor $Q_3$ and $Q_4$ respectively comprises a P+ drain electrode that has a reduced surface area of about 20% to 30% of an average sized drain electrode. The P+ drain electrode is made circular instead of square, to provide a uniform temperature gradient. This results in improved offset due to heat dissipation and changes of width masking etching on $Q_1$ and $Q_2$, which in turn improves the electrical operation of the device 10.

The drain electrode 1 is encircled by a gate electrode 2 fabricated from Al polycrystalline silicon (polysilicon). The gate electrode 2 functions as a shield for the drain electrode 1. The gate electrode 2 is fabricated as an annular ribbon of approximately 5 to 7 times the surface area of the drain electrode 1.

The contact 5 of the gate electrode 2 is connected to a trackable source of circuit potential that electrically shields the transistor device 10, as will be explained in more detail hereinafter with reference to FIG. 2.

A P+ source electrode 3 surrounds the gate electrode 2.

A field plate shield 4 of polysilicon surrounds the entire transistor device 10, and is connected to the positive circuit potential, $V_{CC}$.

Referring to FIG. 2, an operational amplifier circuit 20 is shown in a circuit schematic. This linear operational amplifier is a complex circuit that functions in a range of twice the normal output voltage usually utilized because of component constraints. The operational amplifier 20 has a first differential stage using P− channel transistors and two N− channel devices in series that are biased at the middle of the voltage supply.

A second stage gain utilizes cascading N-channel devices, enclosed drain N− channel current sources, and an output stage for low output impedance drive.

The operational amplifier circuit 20 is a twin tub CMOS process consisting of eleven conventional masking steps described with reference to FIGS. 2a and 2b, respectively.

Referring to FIG. 2a, a P− well mask 50 is first put into an N− substrate 51 (step 1).

A source drain mask is then applied (step 2) followed by a field implant mask (step 3) and a poly gate mask (step 4), as illustrated in FIG. 2b. A P+ implant mask 52 is next inserted in the N− substrate 51 (step 5), and an N+ implant mask 53 (step 6) is then inserted, as shown.

A first contact mask (step 7) is fabricated, followed by a first metal mask (step 8). A second contact mask (step 9) is then followed by a second metal mask (step 10). A final scratch protection mask (step 11) completes the fabrication process.

The amplifier operates at 12 volts even though the transistors usually degrade at approximately 5 volts and fail at 6 volts. Part of the prior art circuit limitations result from the use of single transistors such that the circuit performance is limited by these characteristics of the transistors. The transistors have low threshold voltage due to parasitic fields and higher doping on the drains junction. A bipolar action results from the higher field around the drains.

In order to operate in the 12 volt range, the operational amplifier circuit 20 of this invention uses dual transistors throughout, and shielded transistor device 10 (shown in phantom box) of FIG. 2, and in the chip plan view of FIG. 1. The middle point A of the transistor device 10 is connected to a trackable source of potential shown in the circuit 30 (phantom box). The trackable potential fluctuates, but is always keyed or fixed to a value equivalent to a potential slightly above the average of the positive, $V_{CC}$ bias and the negative, $V_{BB-}$ bias.

Circuit 30 features P− well resistors $R_1$ and $R_2$, respectively, and two transistors $Q_N$ and $Q_M$.

The $Q_N$ and $Q_M$ transistors are used in the potential source circuit 30 to provide balance to the circuit 20 that features dual transistors throughout, and whose transistors are tied to the potential at point A.

The transistor device 10 utilizing the enclosed drains 1 and the trackable gate voltage of point A shield the rest of the circuit from the breakdown usually associated with voltage swings or during slewing.

Point B of circuit 30 would be a true average of the positive and negative bias; usually about 1 volt, for example:

$$V_B = \frac{7 \text{ volts} - 5 \text{ volts}}{2}$$

The voltage at point A is approximately 2 volts (more exactly, $V_B + V_{Threshold(Qn)}$; a better operating voltage.

The total supply voltage output at point "t" is approximately 12 volts, and point "B" swings from $V_{CC}-1$ volt to $V_{BB}$ (total voltage of approximately 11 volts).

A grounded capacitor $C_X$ provides suppression of noise and ripple in circuit 20.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented by the subsequently appended claims.

What is claimed is:

1. An operational amplifier circuit operating at a voltage approximately twice that of its transistor components, comprising:
   a source of positive and negative voltage;
   a number of operational stages, a first stage of which comprises a differential stage, followed by a number of cascading transistor devices and an output stage, each stage characterized by dual transistor pairs that are operatively voltage biased to said source of voltage slightly above an average of said positive and negative voltage; and
   a shielded transistor device operatively connected to said number of operational stages and said voltage source, said transistor device utilizing an enclosed drain for shielding said operational amplifier circuit from voltage breakdown associated with voltage swings.

2. The shielded transistor device of claim 1, wherein said transistor device functions at higher levels of potential generally in excess of 10 volts.

3. The shielded transistor device of claim 1, further comprising a field plate shield disposed about said transistor device.

4. The shielded transistor device of claim 3, wherein said field plate shield comprises a box-shaped ribbon of polysilicon.

5. The shielded transistor device of claim 4, wherein said drain electrode is encircled by said gate electrode comprising an annular ribbon of polysilicon.

6. The shielded transistor device of claim 1, wherein said drain is encircled by a gate electrode comprising an annular ribbon of polysilicon.

7. The shielded transistor device of claim 6, wherein the surface area of said gate electrode is in excess of five times the surface area of said drain.

8. In the shielded transistor device in accordance with claim 1, having a drain electrode encircled by an annular ribbon-shaped gate electrode, said gate electrode being operatively connected to said source of potential and is approximately keyed to an average of positive and negative bias, whereby said shielded transistor device is always operative at voltage levels within its functional range.

9. The shielded device of claim 10, wherein said transistor device functions at higher levels of potential generally in excess of 10 volts.

10. The shielded transistor device of claim 8, further comprising an additional field plate shield disposed about said annular ribbon-shaped gate electrode and a source electrode.

11. The shielded transistor device of claim 10, wherein said field plate shield comprises a box-shaped ribbon of polysilicon.

12. The shielded transistor device of claim 8, further comprising a capacitor element disposed between said trackable source of potential and said gate electrode for reducing noise.

13. The shielded transistor device of claim 8, wherein said transistor device is part of an operational amplifier circuit.

14. The shielded transistor device of claim 13, wherein said transistor device is shielded from other components in said circuit by a channel stop.

15. The shielded transistor device of claim 8, wherein the surface area of said gate electrode is in excess of five times the surface area of said drain electrode.

16. In the shielded transistor device in accordance with claim 1, comprising a drain electrode shielded by a gate electrode comprising an annular ribbon of polysilicon, said gate electrode operatively connected to said source of potential, and a box-like ribbon field plate shield of polysilicon surrounding said gate electrode and said drain electrode.

17. The shielded transistor device of claim 16, wherein the annular ribbon of said gate electrode has a surface area in excess of five times that of the surface area of said drain electrode.

18. The shielded transistor device of claim 16, wherein said potential fluctuates and is keyed to a value above an average of positive and negative circuit bias.

19. The shielded transistor device of claim 16, further comprising a noise suppressing capacitor disposed between said gate electrode and said source of potential.

* * * * *